United States Patent [19]
Stickel et al.

[11] Patent Number: 6,023,067
[45] Date of Patent: Feb. 8, 2000

[54] BLANKING SYSTEM FOR ELECTRON BEAM PROJECTION SYSTEM

[75] Inventors: Werner Stickel, Ridgefield, Conn.; Steven Douglas Golladay, Hopewell Junction, N.Y.

[73] Assignee: Nikon Corporation, Tokyo, Japan

[21] Appl. No.: 09/138,592

[22] Filed: Aug. 22, 1998

[51] Int. Cl.[7] ................................................. H01J 37/09
[52] U.S. Cl. .................................... 250/396 R; 250/398
[58] Field of Search .......................... 250/396 R, 396 ML, 250/398, 492.22, 492.23, 492.2

[56] References Cited

U.S. PATENT DOCUMENTS

| | | | |
|---|---|---|---|
| 5,635,719 | 6/1997 | Petric | 250/396 ML |
| 5,821,542 | 10/1998 | Golladay | 250/396 R |
| 5,856,677 | 1/1999 | Okino | 250/492.22 |

*Primary Examiner*—Kiet T. Nguyen
*Attorney, Agent, or Firm*—Graham S. Jones, II

[57] ABSTRACT

A charged particle beam projection system includes a source of charged particles and a first doublet of condenser lenses with a first symmetry plane through which the beam is directed, located lower on the column. A trim aperture element is located at the first symmetry plane of the first doublet wherein the trim aperture serves as a first blanking aperture. Below the trim aperture there is a shaping aperture. Next is a second doublet of condenser lenses with a second symmetry plane. A third aperture, which is located at the symmetry plane of the second doublet serves as another blanking aperture.

21 Claims, 1 Drawing Sheet

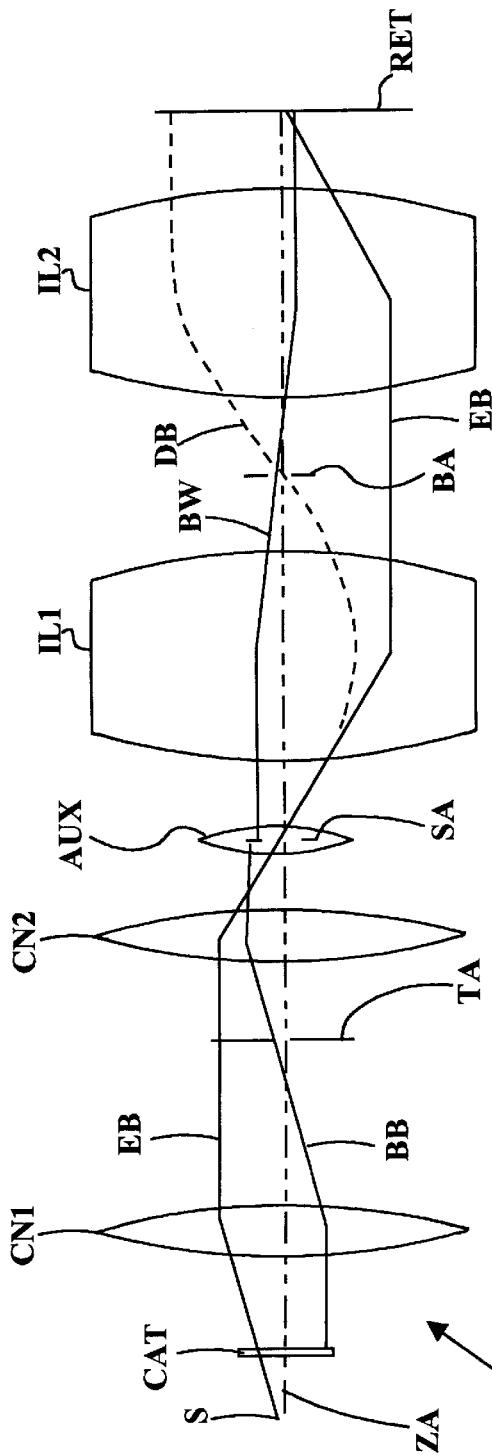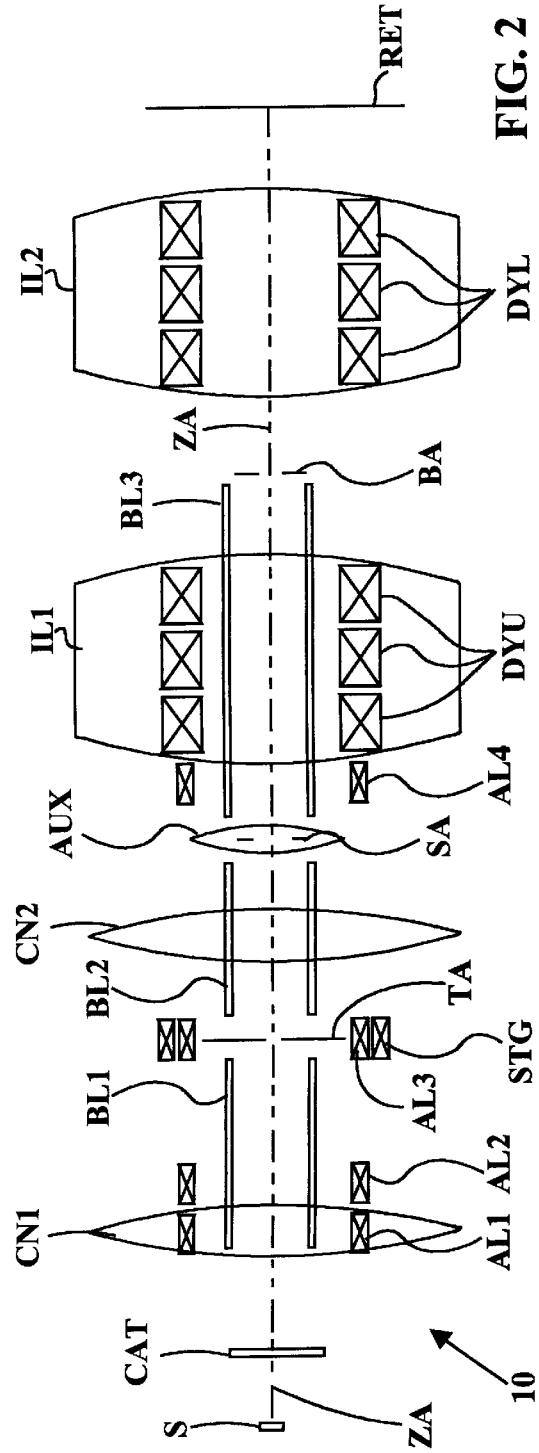

BLANKING SYSTEM FOR ELECTRON BEAM PROJECTION SYSTEM

BACKGROUND OF THE INVENTION

1. Field of the Invention

This invention relates to electron beam deflection and more particularly to blanking of electron beams in electron beam projection systems.

2. Description of Related Art

Problem

In e-beam probe-forming, as well as projection systems the usual method of intensity control (on the target) is to blank the beam for certain periods of time, i.e. preventing the beam from reaching the target by moving it off an aperture (an opening in a diaphragm), so that it is blocked by the diaphragm. This blocking or blanking aperture is strategically located at an image of the electron source, where the beam diameter and intensity profile is clearly defined and concentrated. Without further precaution, however, the beam would also move at the target during the finite time of blanking, leading to a "smearing" of the image the target.

To prevent this problem of smearing, the proper solution is to position the blanking deflector exactly at a point along the beam axis, which is optically conjugate to the target or, in other words, at the object or an intermediate image of the object, the final image of which is the beam spot at the target. In this case the beam would pivot about the point, where the object or its intermediate image is located, and this pivot point would be stationary during blanking.

In many cases, however, this ideal situation is not attainable usually due to spatial constraints. Furthermore, the source image, which is to be moved laterally off the system axis, is in general not represented by a sharply defined or laterally limited beam cross-section, but rather by a distribution usually approximated by a Gaussian or bell-shaped profile, the tails of which laterally extend (in principle) into infinity. Consequently, to blank the beam completely, one would (in principle) require an infinite degree of lateral beam deflection, which, of course, is impossible.

Beam blanking using double deflectors comprising a dual set of deflectors, arranged in tandem, for the purpose of properly positioning the virtual pivot point, as well as supporting fast electric blanking with slow magnetic blanking is practiced in systems like IBM's EL-4, but such a single tandem deflector arrangement would be ineffective for EBPS, such as is described in U.S. Pat. No. 5,635,719 of Petric for "Variable Curvilinear Axis Deflection Means for Particle Optical Lenses".

Traditional probe-forming electron beam lithography systems, in particular shaped-beam systems, incorporate a section, which demagnifies the object, e.g. a square aperture, by a relatively large factor (usually of the order of one hundred (100)) to form a defined image of it at the target, the wafer. The lateral demagnification is accompanied by the corresponding angular magnification, which means that a small deflection of the beam upstream of the demagnification section leads to a large off-axis deflection downstream of the section. A simple blanking device such as a pair of electrostatic plates, therefore, usually provides sufficient blanking. E-beam projection systems do not have a high demagnification ratio between the object and its image at the target, the wafer. It is almost certainly less than ten (10). Therefore the above-mentioned simple blanking device would require—to be efficient—a substantial lengthening of the column to provide the necessary "throwing distance" for the blanker. For practical reasons, such as to fit an EBPS in a clean-room, to lower the center of gravity as well as the mass of the system, and to increase the mechanical resonance frequency, the column has to be as short as possible. Therefore, to provide efficient and sufficient blanking under those most stringent conditions with the necessary frequency response for the high-throughput operation of an EBPS, a more complex blanking system has to be devised, as well as incorporated in a suitable electron-optical configuration, in accordance with this invention, as described herein.

SUMMARY OF THE INVENTION

A charged particle beam projection system includes a source of charged particles and a first doublet of condenser lenses with a first symmetry plane through which the beam is directed, located lower on the column. A trim aperture element is located at the first symmetry plane of the first doublet wherein the trim aperture also serves as a blanking aperture. Below the trim aperture there is a shaping aperture. Next is a second doublet of condenser lenses with a second symmetry plane. An aperture is located at the symmetry plane of the second doublet serving as another blanking aperture.

Definition of "Doublet"

The term "doublet" as used herein denotes a pair of lenses operated under a specific symmetry condition, established in the following way:

A source (of particles) illuminates an object in front of a lens pair. The object is located precisely in the front focal plane of the first lens. The first lens generates an image of the source between the pair, and an image of the (closer) object at infinity. This effectively collimates the rays of particles emerging from the object. Accordingly the first lens is labeled "collimator". The second lens is positioned exactly such that its front focal plane coincides with the back focal plane of the first lens. The second lens focuses the collimated, therefore parallel rays at its back focal plane, which then becomes the image plane for the object. Since the object is now projected into the image plane, the second lens is refined to as "projector". Under this condition the optical magnification of the lens pair is given by the ratio of the focal lengths of projector to collimator, $M=f2/f1$. Simultaneously, the object—image distance, is given by $L=2(f1+f2)$. If lenses of the same shape are used, i.e. if they are by mathematical definition "similar", then their sizes scale with their respective focal lengths. For example, if $f1=4f2$, the collimator must be four times as large as the projector to maintain similarity of the lenses, Consequently, the point of coincidence on the axis of focal points between the lenses, located at a distance from the object of $z1=2f1$, and of $z2=2f2$ from the image, constitutes a point of symmetry. The doublet is often referred to as "symmetric" about the point of coincidence on the system axis. In the special case of $f1=f2$ or unity magnification, the term often used is "mirror-symmetric", even though in the strict mathematical sense the doublet is "point symmetric".

If the source is placed infinitively far upstream of the doublet, its image will appear at the coincidence or symmetry plane. As a consequence, all rays originating from any point on the source or its intermediate image at the symmetry plane will be parallelized by the projector. The doublet then is characterized as a "telecentric symmetric doublet". If the lenses are of the magnetic type, their field polarities are generally chosen to be opposite to each other as to completely cancel the image rotation caused by each individual lens. One then speaks of an "antisymmetric doublet".

The reason for operating the lenses in the described way as a doublet is that several aberrations are eliminated (as one lens compensates the aberrations of the other lens in exactly the right ratio) and consequently image blur is reduced.

BRIEF DESCRIPTION OF THE DRAWINGS

The foregoing and other aspects and advantages of this invention are explained and described below with reference to the accompanying drawings, in which:

FIG. 1 shows a schematic diagram of an Electron Beam Projection System (EBPS) in accordance with this invention.

FIG. 2 shows the device of FIG. 1 with the more details of the hardware illustrated to provide additional explanation as to how the EBPS device operates.

DESCRIPTION OF THE PREFERRED EMBODIMENT

FIG. 1 shows a schematic diagram of the optics of the illumination section of an Electron Beam Projection System (EBPS) 10 such as described by H. C. Pfeiffer and W. Stickel in Microelectronics Engineering 27 (995) 143. The purpose of this section is to provide appropriately distributed and positioned (electron) radiation energy to the object of the subsequent projection section, which generates a (reduced) image of this object at its target plane. The object contains an (enlarged) replica of the integrated circuit pattern, a reticle RET, to be reproduced in the radiation-sensitive material covering the substrate, e.g. a semiconductor wafer, in the target plane.

The lines ZA, EB and BB/BW symbolically represent, respectively, the central or symmetry axis ZA of the section, the central imaging ray EB of the (virtual) source S, and the central imaging ray BB/BW of the so-called "cross-over", where all rays originating from the extended surface of the electron emitter or cathode CAT merge for the first time. The lenses CN1 and CN2 as well as the lenses IL1 and IL2 are arranged and operated in an optical configuration called an "anti-symmetric doublet", each having a symmetry plane, at which the trim aperture TA and blanking aperture BA, respectively, are placed. The auxiliary lens AUX provides an additional degree of freedom to assure proper placement of the cross-over image at blanking aperture BA.

Trim aperture TA serves to trim or truncate the outer fringes of the intensity distribution in the cross-over, which is in general non-uniform (approximately Gaussian), such that the combined image of trim aperture TA and its truncated intensity distribution matches or is slightly smaller than the size of the opening in the diaphragm denoted as blanking aperture BA.

The ray BW is in actuality the continuation of central imaging ray BB. This discontinuity, between ray BB and ray BW shown at the shaping aperture SA, indicates that the beam is "shaped" into the proper form required at the reticle RET, e.g. a square. For that purpose the beam which includes ray BB slightly "overfills" the shaping aperture SA to ensure a uniform intensity profile across the opening in the diaphragm of the shaping aperture SA and ultimately across its image at the reticle RET, which illuminates an equally shaped "subfield" in the reticle RET. Finally, the ray DB represents the shaping aperture imaging ray EB, when it is deflected to illuminate an off-axis subfield in the reticle RET. The condition for ray (beam) DB is to cross the system axis ZA and pass through blanking aperture BA under any deflected condition.

FIG. 2 shows additional details required to provide correct illumination of reticle subfields and consequently proper operation of the entire EBPS 10. Magnetic deflectors ALi are required to maintain beam alignment with respect to the apertures, i.e. blanking aperture BA, shaping aperture SA and trim aperture TA. A set of magnetic quadrupoles called a stigmator STG is used to ensure symmetric (square) beam shape at shaping aperture SA. There are sets of electric deflection plates BLi (where "i" is an integer greater than 1, e.g. BL1, BL2, and BL3) for providing electric deflection of the beam. These are the devices, the arrangement and operation of which are at the core of the present invention.

Electric deflection, though less efficient than magnetic deflection, is used for the high speed or high frequency response required for precise exposure dose control at the target of the EBPS 10. This is accomplished by deflecting the beam off the aperture openings, such that all radiation is blocked by the diaphragms for predetermined time periods. Finally, magnetic deflectors DYU and DYL operate to position the beam over the (off-axis) subfield in the reticle RET selected at the time. Their relative strengths and deflection directions are adjusted to guarantee a pivot point of the beam fixed at the center of the opening in the diaphragm of blanking aperture BA, as well as perpendicular landing at the reticle RET. The combination of illuminator lens doublet IL1 & IL2, deflectors DYU & DYL, and additional corrector elements not shown here constitute an optic system referred to as Curvilinear Variable Axis Lens or CVAL. CVAL provides best optical performance or minimum image blurring and distortion at largest off-axis positions and shortest distance between object and image, namely shaping aperture and reticle RET.

For an Electron Beam Projection System (EBPS) in accordance with this invention, a tandem blanking system is provided in combination with copending U.S. patent application Ser. No. 09/138,595, filed on Aug. 22, 1998, filed concurrently herewith of Stickel and Golladay for "Illumination Deflection System for E-Beam Projection" consisting of three (possibly four) sets of electric blanking deflectors BL1, BL2, BL3, supported, if in practice required, by magnetic deflectors at corresponding axial locations, as well as not one, but two apertures.

The first two deflectors BL1 and BL2 are operated in tandem to place the (virtual) pivot point into the object plane of shaping aperture SA.

The first set of blanking deflector plates BL1 extend from within the lens CN1 almost to the trim aperture TA. Blanking deflector plates BL2 occupy the space between trim aperture TA and shaping aperture SA. The third set of blanking deflector plates BL3 extends from just beyond shaping aperture SA to a point close to the blanking aperture BA.

The third set of blanking deflector plates BL3, provides the actual blanking. If needed, this third set of blanking plates BL3 may be operated again in tandem with a fourth set of blanking plates between blanking aperture BA and the target which is reticle RET, to prevent any motion of the object image at the reticle RET during blanking.

While each of the individual blanking plate sets BL1, BL2, and BL3, in the present configuration shown in FIG. 2

(not shown in FIG. 1 for convenience of illustration) of the EBPS taken alone is too insensitive to provide adequate blanking, their combined action is efficient. Since the total beam power is substantially higher in EBPS than in any traditional e-beam system used in lithography, it is important to manage thermal energy dissipation properly. The blanking configuration of FIGS. 1 and 2 achieves that:

a) The first (trim) aperture TA dissipates about 50% of the beam power, which is in the order of at least 40 Watts.

b) The double-deflection of the first two sets of plates BL1/BL2 keeps the beam stationary at the shaping aperture SA, more importantly for the purpose of preventing uneven thermal load on its structure than any beam motion effect at the target RET.

Due to the trimming action of the trim aperture TA (which is the initial blanking aperture) in the first lens doublet CN1/CN2 the beam diameter at the blanking aperture BA (which is the other blanking aperture) in the second lens doublet IL1/IL2 is well defined. Therefore, the blanking aperture BA can be designed slightly larger, avoiding inadvertently intersecting the beam as the result of any undesired beam motion. This is of particular importance in EBPS, because the second lens doublet IL1/IL2 acts in combination with a set of magnetic deflectors (upper deflection yokes DYU and lower deflection yokes DYL), which are needed to scan the beam across the target RET (the reticle) over a large distance off the system axis. A small misadjustment of the magnetic deflectors DYU/DYL could easily cause substantial motion at the blanking aperture BA, therefore inadvertently causing intensity modulation at the target RET, and render the system inoperable.

Furthermore, the beam blanking now requires only little more off-axis deflection than the beam diameter at the (second) shaping aperture SA, allowing for lower deflection voltage and therefore increased speed, since any residual current still passing through the shaping aperture SA due to noise jitter on the beam is negligible thanks to the attenuation of the beam by simultaneous deflection over the trim aperture.

In turn the deflection at the trim aperture TA can be minimized for equivalent benefit, since only substantial attenuation, not complete blanking is required there. This combined blanking with electric deflectors BL1, BL2 and BL3 may be adequate for most operating conditions, but for prolonged times of blanking required e.g. during wafer exchange, additional magnetic deflection, slow but strong, may be used for assistance. In all cases, proper timing of the activated deflectors both electric deflectors BL1, BL2 and BL3 and/or magnetic deflectors is essential for best results.

Copending U.S. patent application Ser. No. 09/138,595, filed on Aug. 22, 1998, concurrently herewith of Stickel and Golladay for "Illumination Deflection System for E-beam Projection" describes an illumination system adapted for use in the system of this invention is described in below in a general way but more details are found in the copending application. The two-lens combination of this invention of lenses IL1 and IL2 is an improved configuration which simplifies the lens system, uses a reduced number of deflectors, and widens the design space for those deflectors. At the same time it still maintains the quality (blur and distortion) required for the image of the shaping aperture SA, which illuminates the subfield of the reticle at the position selected by the deflectors incorporated into this configuration, which approximates an ideal doublet. It:

a. permits a (for other reasons preferable) 1:1 imaging of a preceding beam-shaping (square) aperture onto the reticle, b. provides space despite overall length reduction for enough magnetic deflectors as required to move the beam from its on-axis position at the shaping aperture to any off-axis position at the reticle, c. provides the opportunity to place an aperture stop close to or at the center of the doublet to serve as a means to control the timing of the beam impinging on the reticle, commonly known as blanking aperture d. permits operation of the deflectors such that the beam passes through the (stationary on-axis) blanking aperture at all times, when needed, regardless of its final position at the reticle, without causing excessive aberrations like blurring and distortion.

It has been found by computer simulation that the length of the illuminator-deflector section as well as the number of deflectors can be reduced by more than 40% from the presently implemented configuration, without significantly compromising performance and with the added bonus of accommodating a more efficient beam blanking system, which is crucial for for accurate and fast exposure control.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A charged particle beam projection system comprising:
   a source of charged particles,
   a first pair of condenser lenses,
   a first aperture located between said condenser lenses of said first pair of condenser lenses,
   a second pair of condenser lenses with a cross-over positioned therebetween, and
   a blanking aperture positioned at said cross-over.

2. A charged particle beam projection system in accordance with claim 1 including:
   first blanking plates between said first pair of condenser lenses and said first aperture,
   a second aperture comprising a shaping aperture,
   second electrostatic alignment plates between said first aperture and said second aperture, and
   a third aperture located in said second pair of condenser lenses wherein said third aperture comprises a blanking aperture, and
   third electrostatic alignment plates between said second aperture and said third aperture.

3. A charged particle beam projection system in accordance with claim 1 wherein:
   said first pair of condenser lenses comprising a first doublet including a first symmetry plane, and
   said first aperture comprises a trim aperture located at said first symmetry plane of said first doublet wherein said trim aperture also serves as a blanking aperture.

4. A charged particle beam projection system in accordance with claim 3 including:
   first blanking plates between said first condenser lens and said trim aperture,
   a second aperture, and
   second electrostatic alignment plates between said trim aperture and said second aperture.

5. A charged particle beam projection system in accordance with claim 3 including:
   first blanking plates between said first condenser lens and said trim aperture,
   a second aperture comprising a shaping aperture and second electrostatic alignment plates between said trim aperture and said second aperture, and
   said second pair of lenses having a second symmetry plane and a third aperture located at the second symmetry plane of said second pair of lenses wherein said third aperture comprises another blanking aperture, and
   third electrostatic alignment plates between said second aperture and said third aperture.

6. A charged particle beam projection system comprising:
   a source of charged particles,
   a first doublet of condenser lenses,
   a first aperture located between said condenser lenses of said first doublet,
   a second aperture comprising a shaping aperture,
   a second doublet of condenser lenses with a second symmetry plane, and
   a symmetry plane aperture located at the symmetry plane of said second doublet wherein said symmetry plane aperture comprises another blanking aperture.

7. A charged particle beam projection system in accordance with claim 6 including:
   first blanking plates between said first condenser lenses and said first aperture,
   second electrostatic alignment plates between said first aperture and said second aperture, and
   a third aperture located in said second doublet wherein said third aperture comprises a blanking aperture, and
   third electrostatic alignment plates between said second aperture and said third aperture.

8. A charged particle beam projection system in accordance with claim 7 wherein:
   said first doublet of condenser lenses includes a first symmetry plane, and
   said first aperture comprises a trim aperture located at said first symmetry plane of said first doublet wherein said trim aperture also serves as a blanking aperture.

9. A charged particle beam projection system in accordance with claim 8 including:
   first blanking plates between said first condenser lens and said trim aperture, and
   second electrostatic alignment plates between said trim aperture and said second aperture.

10. A charged particle beam projection system in accordance with claim 8 including:
    first blanking plates between said first condenser lens and said trim aperture,
    second electrostatic alignment plates between said trim aperture and said second aperture,
    said second doublet having a symmetry plane with a third aperture located at the symmetry plane of said second doublet wherein said third aperture comprises another blanking aperture, and
    third electrostatic alignment plates between said second aperture and said third aperture.

11. An electron beam projection system comprising:
    a source of an electron beam,
    a first doublet of condenser lenses with a first symmetry plane,
    a first aperture comprising a trim aperture located at said first symmetry plane of said first doublet also serving as a first blanking aperture,
    a second aperture comprising a shaping aperture located below said trim aperture,
    a second doublet of condenser lenses with a second symmetry plane is located below said second aperture, said second doublet having a symmetry plane,
    a third aperture located at the symmetry plane of said second doublet wherein said third aperture comprises another blanking aperture,
    first blanking plates between said first condenser lens and said trim aperture, and
    second electrostatic alignment plates between said trim aperture and said second aperture.

12. An electron beam projection system in accordance with claim 11 including:
    said first blanking plates extend from said first condenser lens to near said trim aperture, and said second electrostatic alignment plates occupy the space between said trim aperture and said second aperture.

13. An electron beam beam projection system in accordance with claim 11 including:
    said first blanking plates extend from said first condenser lens proximate to said trim aperture,
    said second electrostatic alignment plates occupy the space between said trim aperture and said second aperture,
    said third, blanking aperture is slightly larger than said trim aperture, and
    third electrostatic alignment plates between said second aperture and said third aperture.

14. A method of operating a charge particle beam projection system comprising:
    providing a source of charged particles,
    providing a first pair of condenser lenses,
    providing a first aperture located between said condenser lenses of said first pair of condenser lenses,
    providing a second pair of condenser lenses with a cross-over therebetween, and
    providing a blanking aperture positioned at said cross-over.

15. A method in accordance with claim 14 including:
    said first pair of condenser lenses comprising a first doublet including a first symmetry plane,
    said first aperture comprising a trim aperture located at said first symmetry plane of said condenser lenses of said first pair of condenser lenses wherein said trim aperture also serves as a blanking aperture.

16. A method in accordance with claim 15 including:
    providing first blanking plates between said first condenser lens and said trim aperture, providing a second aperture comprising a shaping aperture, and
    providing second electrostatic alignment plates between said trim aperture and said second aperture.

17. A method in accordance with claim 14 including:
    providing first blanking plates between said first condenser lens and said first aperture,
    providing a second aperture with a second electrostatic alignment plates between said first aperture and said second aperture,
    said second pair of lenses having a second symmetry plane, providing a third aperture located at the second symmetry plane of said second pair of lenses wherein said third aperture comprises another blanking aperture, and providing third electrostatic alignment plates between said second aperture and said third aperture.

18. A method of operating a charge particle beam projection system comprising:

providing a source of charged particles, providing a first doublet of condenser lenses, providing a first aperture located between said condenser lenses of said first doublet, providing a second aperture comprising a shaping aperture, providing a second doublet of condenser lenses with a second symmetry plane, and providing a symmetry plane aperture located at the symmetry plane of said second doublet wherein said symmetry plane aperture comprises another blanking aperture.

19. A method in accordance with claim 18 including:

with said first doublet including a first symmetry plane, said first aperture comprising a trim aperture located at said first symmetry plane of said condenser lenses of said first doublet wherein said trim aperture also serves as a blanking aperture.

20. A method in accordance with claim 19 including:

providing first blanking plates between said first condenser lens and said trim aperture, and providing second electrostatic alignment plates between said trim aperture and said second aperture.

21. A method in accordance with claim 19 including:

providing first blanking plates between said first condenser lens and said first aperture, providing second electrostatic alignment plates between said first aperture and said second aperture, and providing a third aperture located at the symmetry plane of said second doublet wherein said third aperture comprises another blanking aperture, and providing third electrostatic alignment plates between said second aperture and said third aperture.

* * * * *